United States Patent [19]
Sudo et al.

[11] Patent Number: 5,555,520
[45] Date of Patent: Sep. 10, 1996

[54] TRENCH CAPACITOR CELLS FOR A DRAM HAVING SINGLE MONOCRYSTALLINE CAPACITOR ELECTRODE

[75] Inventors: Akira Sudo, Yokohama; Yusuke Kohyama, Yokosuka; Haruhiko Koyama, Ichikawa, all of Japan

[73] Assignee: Kabushiki Kaisha Toshiba, Kawasaki, Japan

[21] Appl. No.: 353,368

[22] Filed: Dec. 2, 1994

[30] Foreign Application Priority Data

Dec. 3, 1993  [JP]  Japan .................... 5-304182

[51] Int. Cl.⁶ ................................. H01L 29/68
[52] U.S. Cl. .................. 365/149; 257/301; 257/304; 257/305
[58] Field of Search ............. 365/149; 257/301, 257/304, 305, 306, 309, 622

[56] References Cited

U.S. PATENT DOCUMENTS

| | | | |
|---|---|---|---|
| 4,803,535 | 2/1989 | Taguchi | 257/301 |
| 5,023,683 | 6/1991 | Yamada | 257/309 |

FOREIGN PATENT DOCUMENTS

| | | | |
|---|---|---|---|
| 2106958 | 4/1990 | Japan | 257/301 |
| 3-69185 | 10/1991 | Japan . | |
| 4212451 | 8/1992 | Japan | 257/301 |

*Primary Examiner*—David C. Nelms
*Assistant Examiner*—Vu A. Le
*Attorney, Agent, or Firm*—Banner & Allegretti, Ltd.

[57] ABSTRACT

The present structure is characterized by the electrode of a trench capacitor of a DRAM and a periphery thereof. A trench is formed adjacent to an N type region in a substrate. An insulating film is formed on the side wall of this trench and only a part of the insulating film around the upper portion of the trench is removed, forming a window. An N type polycrystalline silicon film of a lower capacitor electrode is formed over a region from the bottom of the trench to below the window, and a capacitor insulating film is formed on this polycrystalline silicon film. A polycrystalline silicon film which becomes a first upper capacitor electrode is formed on the capacitor insulating film, filling the trench up to the lower edge of the window. A monocrystalline silicon film which becomes a second upper capacitor electrode is formed on the latter polycrystalline silicon film in such a way as to contact an N type region, filling the upper portion of the trench. An insulating film similar to a gate insulating film on the substrate is formed on the monocrystalline silicon film.

17 Claims, 7 Drawing Sheets

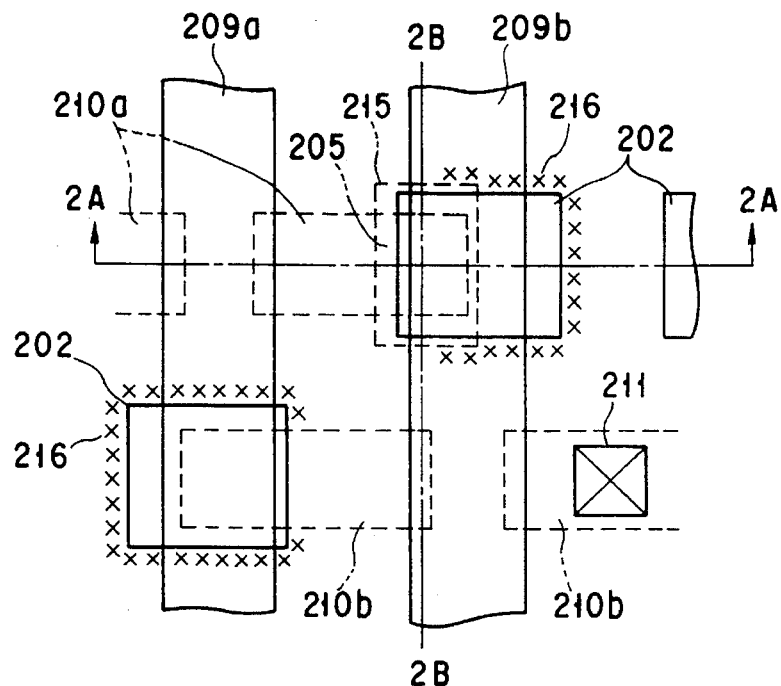
FIG. 1
(PRIOR ART)
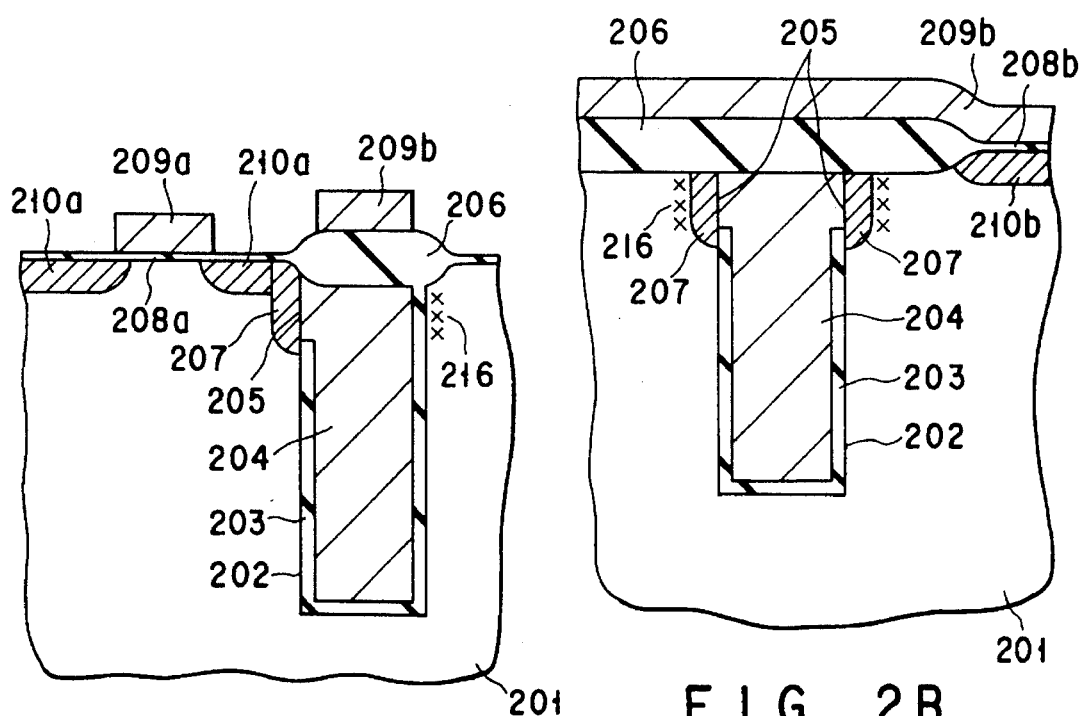
FIG. 2A
(PRIOR ART)
FIG. 2B
(PRIOR ART)

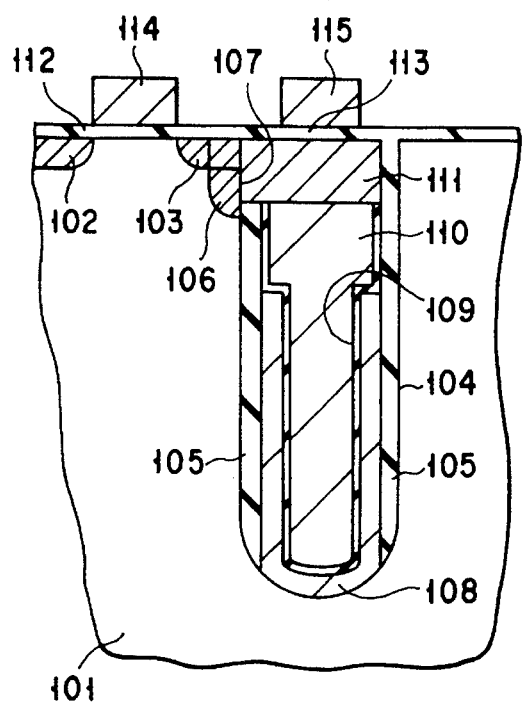
F I G. 3
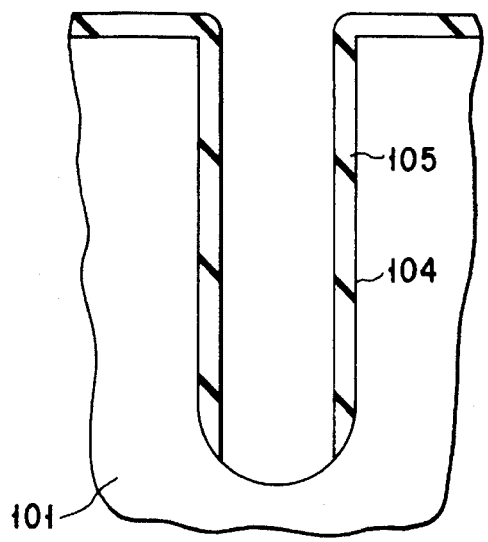
F I G. 4
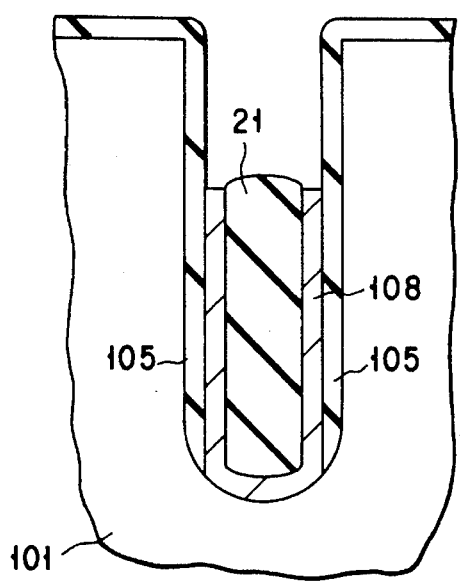
F I G. 5
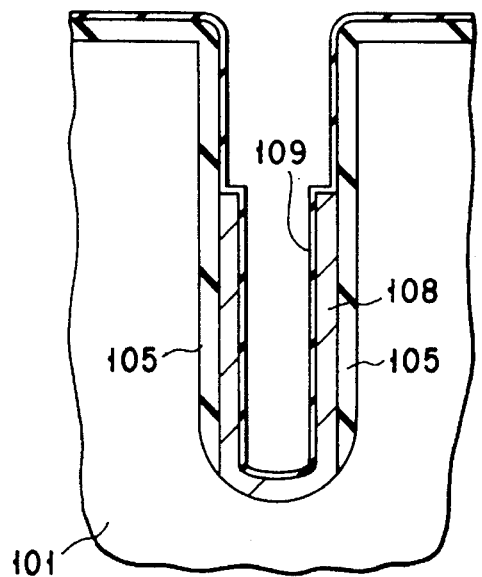
F I G. 6

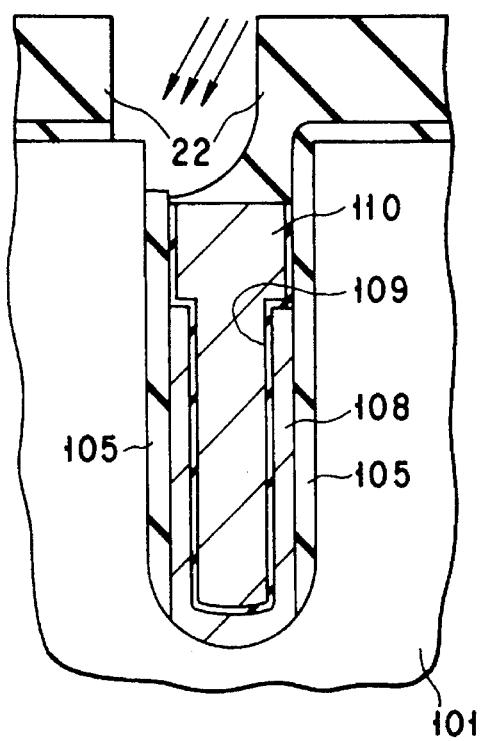
F I G. 7
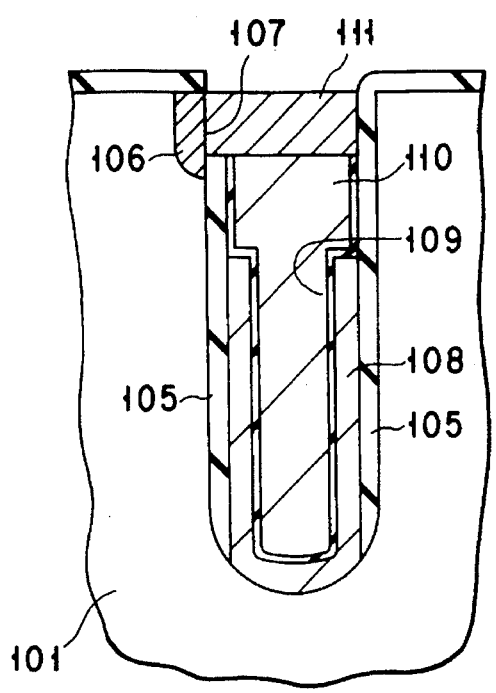
F I G. 8
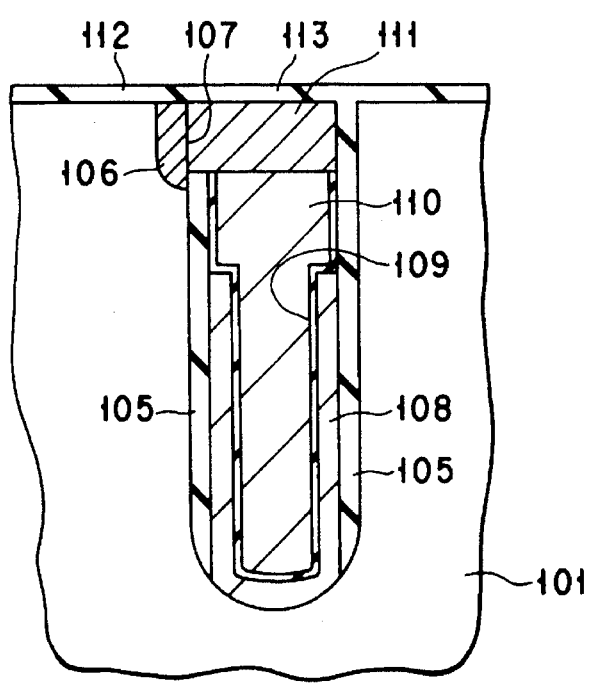
F I G. 9

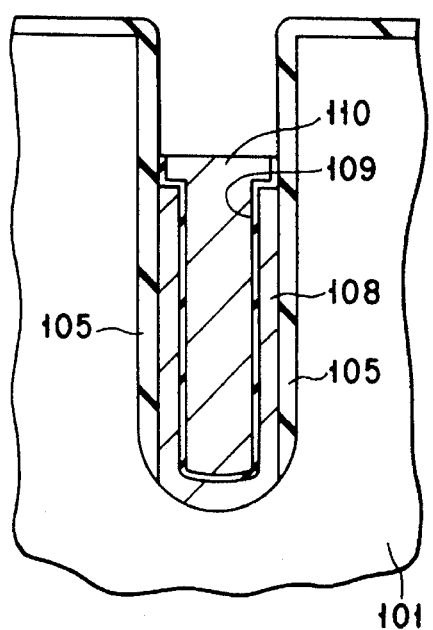
F I G. 14
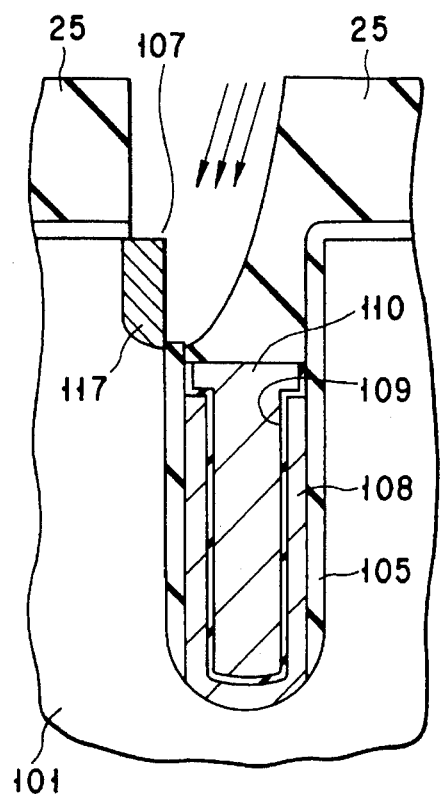
F I G. 15
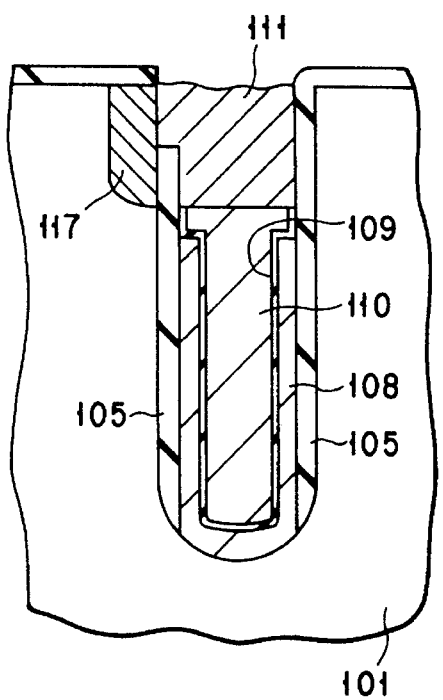
F I G. 16
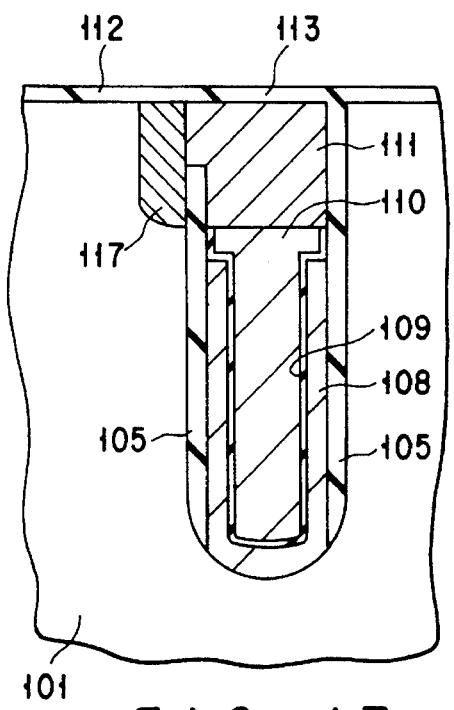
F I G. 17

TRENCH CAPACITOR CELLS FOR A DRAM HAVING SINGLE MONOCRYSTALLINE CAPACITOR ELECTRODE

BACKGROUND OF THE INVENTION

1. Field of the Invention

The present invention relates to a semiconductor memory device constituted by a dynamic random access memory (DRAM) which has a trench capacitor and a side-wall contact, and a method of fabricating the same.

2. Description of the Related Art

The technique disclosed in Jpn. Pat. Appln. KOKOKU Publication No. 3-69185 will be described with reference to FIGS. 1 and 2. FIG. 1 is a plan view of a pattern showing the trench capacitor cell portion of a conventional DRAM, and FIGS. 2A and 2B are cross-sectional views respectively along the lines 2A—2A and 2B—2B in FIG. 1.

A trench 202 is formed on a P type silicon substrate 201, with an insulating film 203 formed on the inner wall of the trench 202. Phosphorus-doped polycrystalline silicon 204 is buried in the trench 202, and an oxide film 206 is formed on the polycrystalline silicon. To remove a part of the insulating film 203 at the upper edge portion of the trench 202, a resist film is formed on the trench 202 and an opening (215) is made. As a result, a window 205 is formed through which phosphorus from the polycrystalline silicon 204 is diffused into the substrate, thus forming an N type diffusion layer 207. Formed on the substrate are gate insulating films 208a and 208b, gate electrodes 209a and 209b (word lines), and source/drain diffusion layers 210a and 210b. The N type diffusion layer 207 is connected to the source/drain diffusion layer 210a. Reference numeral "211" denotes a bit line contact.

The above structure has the following shortcomings. First, the region which includes the inner wall of the trench 202, the N type diffusion layer 207 and the substrate 201 has a gate control diode structure. If a potential is given to the polycrystalline silicon 204, a depletion layer stretches around the insulating film 203 on the trench's inner wall and an inversion layer is continuously formed along the outer surface of the trench 202, starting from the N type diffusion layer 207. This increases the junction leak current between the substrate 201 and the N type diffusion layer 207, which contacts the polycrystalline silicon 204.

To avoid the junction leak current, the capacitance of the capacitor should be reduced by some amount. This is accomplished by forming the insulating film 203 thick on the trench's inner wall at the price of an increase in capacitance.

Secondly, punch-through may occur in the N type diffusion layer 207 around the upper portion of the trench 202 because of the short distance from another source/drain region 210b. While this problem can be overcome by making the distance sufficient enough not to cause punch-through, this approach stands in the way of higher integration.

Thirdly, according to the above structure, the gate electrode 209b of another adjoining cell transistor is formed on the oxide film 206, which electrically isolates the gate electrode 209b from the polycrystalline silicon 204. The oxide film 206 has a thickness of several thousand angstroms, and stress is applied to the substrate in this oxidizing step, yielding crystal defects 216 around the upper portion of the trench 202.

The crystal defects 216, if formed, accelerate the problem of the junction leak current. The oxide film 206 should therefore be made thin enough not to produce the crystal defects. It is however difficult to make the oxide film 206 thinner than the current thickness in view of the insulation breakdown of the polycrystalline silicon film 204.

In short, according to the prior art, the potential applied to the polycrystalline silicon filling the trench may cause punch-through to the source/drain regions of another adjoining cell or may generate the junction leak current between the diffusion layer contacting the polycrystalline silicon and the substrate. In particular, this junction leak current becomes more prominent by the crystal defects (216) formed around the upper portion of the trench. The crystal defects are an inevitable result of forming the oxide film which accomplishes insulative isolation from another gate electrode (polycrystalline silicon) on the trench.

SUMMARY OF THE INVENTION

It is therefore an object of the present invention to provide a highly reliable semiconductor memory device which contributes to the integration and can reduce the junction leak current without reducing the trench capacitance, and a method of fabricating the same.

This object is accomplished by the following structure.

A semiconductor memory device having a trench capacitor for storing data, comprising:

a semiconductor substrate of a first conductivity type;

a conductor region of a second conductivity formed in a surface of the semiconductor substrate;

a trench bored adjacent to the conductor region in the semiconductor substrate;

a capacitor insulating film formed in the trench;

a capacitor electrode formed in such a way as to bury the trench, at least an upper portion in the trench being monocrystalline; and an insulating film on the capacitor electrode.

With the above structure, as the upper portion of the trench is the monocrystalline capacitor electrode, the insulating film on the trench has an excellent film quality and can provide sufficient breakdown even when it is as thin as the gate insulating film. This can suppress the generation of crystal defects in the substrate around the upper portion of trench, which accelerates the junction leak.

Punch-through between adjoining cells can be prevented and the gate control diode structure can be avoided both by the provision of the semiconductor region of the first conductivity type that contacts the conductor region of the second conductivity type which extends from the upper portion of the capacitor electrode to the substrate. This structure reduces the junction leak without reducing the trench capacitance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view of a pattern showing the trench capacitor cell portion of a conventional DRAM;

FIGS. 2A and 2B are cross-sectional views respectively along the lines 2A—2A and 2B—2B in FIG. 1;

FIG. 3 is a cross-sectional view showing the structure of the essential portion of the trench capacitor cell of a DRAM according to a first embodiment of the present invention;

FIGS. 4 through 9 are cross-sectional views illustrating the step-by-step fabrication method for the structure shown in FIG. 3;

FIGS. 13 through 17 are cross-sectional views illustrating the step-by-step fabrication method for the structure shown in FIG. 12;

DETAILED DESCRIPTION OF THE PREFERRED EMBODIMENTS

Figure 10:
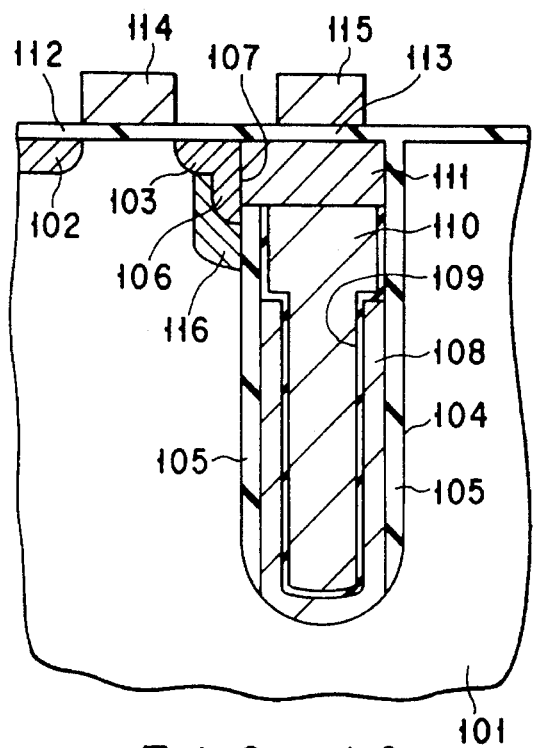
FIG. 10 is a cross-sectional view showing the structure of the essential portion of the trench capacitor cell of a DRAM according to a second embodiment of this invention.

FIG. 3 presents a cross-sectional view showing the structure of the essential portion of the trench capacitor cell of a DRAM according to the first embodiment of the present invention. N type regions 102 and 103 are selectively formed in the surface of a P type region in a monocrystalline silicon substrate 101, and a trench 104 is formed adjacent to the N type region 103. An insulating film ($SiO_2$ film) 105 is formed on the side wall of this trench 104. Just a part of the insulating film 105 around the upper portion of the trench 104 is removed, and a window 107 through which an N type region 106 in the substrate contacts the trench 104 is formed there. The region from the bottom of the trench 104 where the substrate 101 is exposed to the surface of the insulating film 105 is covered with an N type polycrystalline silicon film 108 as a lower capacitor electrode. The upper edge portion of the polycrystalline silicon film 108 is positioned below the N type regions 103 and 106. A capacitor insulating film (SiN film) 109 is formed on this polycrystalline silicon film 108. A polycrystalline silicon film 110 which becomes a first upper capacitor electrode is formed on this capacitor insulating film 109, filling the trench 104 to the lower edge of the window 107. A monocrystalline silicon film 111, which becomes a second upper capacitor electrode, is formed on this polycrystalline silicon film 110 in such a way as to contact the N type region 106, filling the upper portion in the trench 104. Formed on this monocrystalline silicon film 111 is an insulating film 113 similar to a gate insulating film 112 on the substrate 101. A gate electrode 114 of a cell transistor which uses the N type regions 102 and 103 as its source/drain regions is formed on the monocrystalline silicon film 111, and a gate electrode 115 of another adjoining memory cell transistor is formed on the insulating film 113 on the trench 104.

FIGS. 4 through 9 present cross-sectional views illustrating the step-by-step fabrication method for the structure shown in FIG. 3. First, with an SiN film or the like used as a mask, the trench 104 having a diameter of about 0.5 μm is formed 5 μm deep from the surface of the silicon substrate 101, as shown in FIG. 4. Next, the trench's inner wall is coated with the $SiO_2$ film 105 having a thickness of approximately 20 nm by high temperature thermal oxidization. The $SiO_2$ film 105 at the bottom of the trench 104 is selectively removed by anisotropic etching.

Then, the polycrystalline silicon film 108 having a thickness of about 50 nm is deposited in the trench as shown in FIG. 5. The polycrystalline silicon film 108 which becomes the lower capacitor electrode is doped with phosphorus of a high concentration (e.g., $1\times10^{19}$ to $5\times10^{20}/cm^3$) at the time or after the film 108 is formed. Next, using a resist 21 buried to the height of about 3 μm from the trench's bottom as a mask, the exposed polycrystalline silicon film 108 is removed by isotropic dry etching. Then, the resist 21 is removed and the SiN film 109 is deposited about 5 nm thick on the polycrystalline silicon film 108 and the $SiO_2$ film 105 as shown in FIG. 6 by the CVD technique.

Next, as shown in FIG. 7, the polycrystalline silicon film 110, which becomes the first upper capacitor electrode and is doped with high-concentration phosphorus, is deposited in the trench by the CVD technique (low pressure CVD), and the polycrystalline silicon film 110 is selectively etched back by isotropic dry etching. Through this treatment, the polycrystalline silicon film 110 is buried to the height of about 4 μm from the trench's bottom. Thereafter, with the polycrystalline silicon film 110 as a mask, the exposed SiN film 109 is removed by a hot $H_3PO_4$ solution. Then, a resist 22 is formed on the substrate 101 in such a way as to expose a part of the region around the upper portion of the trench. With the resist 22 as a mask, the exposed $SiO_2$ film 105 is removed by a buffer HF solution. Subsequently, phosphorus with a concentration of $1\times10^{19}/cm^3$ is obliquely ion-injected in the exposed substrate to form the N type region 106 in the window 107.

After the resist 22 is removed, the N type monocrystalline silicon film 111 which becomes the second upper capacitor electrode is grown on the polycrystalline silicon film 110 using the substrate exposed through the window 107 as seed crystal under the atmosphere of $SiCl_4+H_2$ gas, filling the upper portion inside the trench, as shown in FIG. 8. The impurity injection in the monocrystalline silicon film 111 may be executed after the film 111 is formed. The impurity concentration of the N type monocrystalline silicon film 111 is set to about $1\times10^{18}/cm^3$, for example.

Next, as shown in FIG. 9, the resultant structure is etched back including the $SiO_2$ film 105 on the substrate 101 to form the gate insulating films 112 and 113, i.e., the $SiO_2$ film in the same step. Then, memory cell transistors of a DRAM are formed by a well known technique. More specifically, the gate electrodes 114 and 115 are patterned on the $SiO_2$ film (112, 113), and the N type regions 102 and 103 which become the source/drain regions are formed using the gate electrodes 114 and 115 as masks. Through the above processes, the structure in FIG. 3 is obtained.

According to the structure of the first embodiment, since the upper portion inside the trench is filled with the monocrystalline silicon film 111, the insulating film 113 on the trench has as an excellent film quality as the gate insulating film 112, and can have a sufficient breakdown voltage even if the insulating film 113 is made thin. This can suppress the generation of crystal defects in the substrate around the upper portion of the trench, which would accelerate the junction leak.

FIG. 10 is a cross-sectional view showing the structure of the essential portion of the trench capacitor cell of a DRAM according to the second embodiment of this invention. The structure in FIG. 10 differs from the structure in FIG. 3 in that there are two types, P type and N type, of impurities doped in the substrate from the window 107. That is, a P type region 116 formed under and in contact with the N type regions 103 and 106.

Figure 11:
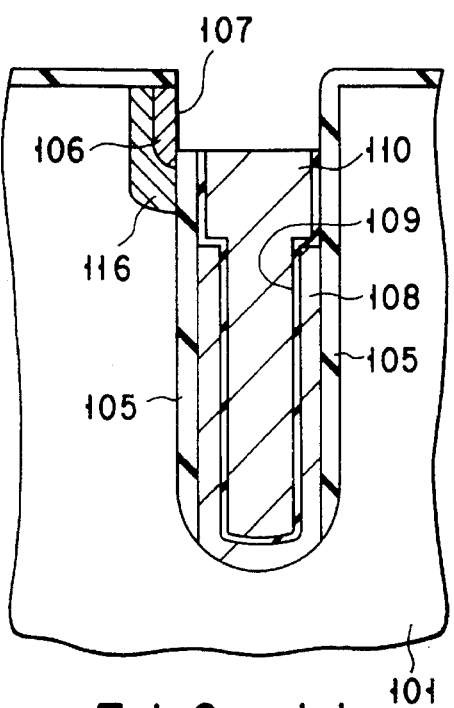
FIG. 11 is a cross-sectional view illustrating the essential portion of a fabrication method for the structure shown in FIG. 10.

FIG. 11 is a cross-sectional view illustrating the essential portion of a fabrication method for the structure shown in FIG. 10. The fabrication procedures for the structure in FIG. 10 are the same up to the step shown in FIG. 6. In the step shown in FIG. 7, first, boron ions are injected at a high acceleration voltage to form a P type region (116). Subsequently, phosphorus ions are injected at the same acceleration voltage as used in the step in FIG. 7. After the $SiO_2$ film 105 and resist 22 are removed, the N type region 106 is formed in the substrate through the window 107 and the P type region 116 is formed around the N type region 106, as shown in FIG. 11. Thereafter, the steps illustrated in FIGS. 8 and 9 are performed, yielding the structure in FIG. 10.

According to the second embodiment, the gate control diode structure which causes the junction leak can be avoided. More specifically, as the P type region 116 is provided in the vicinity of the region directly under the portion where the second upper capacitor electrode (monocrystalline silicon film 111) is joined to the substrate 101 via the window 107, it becomes difficult that an inversion layer and a depletion layer are formed there along the outer surface of the trench. In other words, this P type region 116 prevents the inversion layer lying along the outer surface of the trench from being continuous to the N type region 106 due to the influence of the potential applied to the capacitor electrode.

Figure 12:
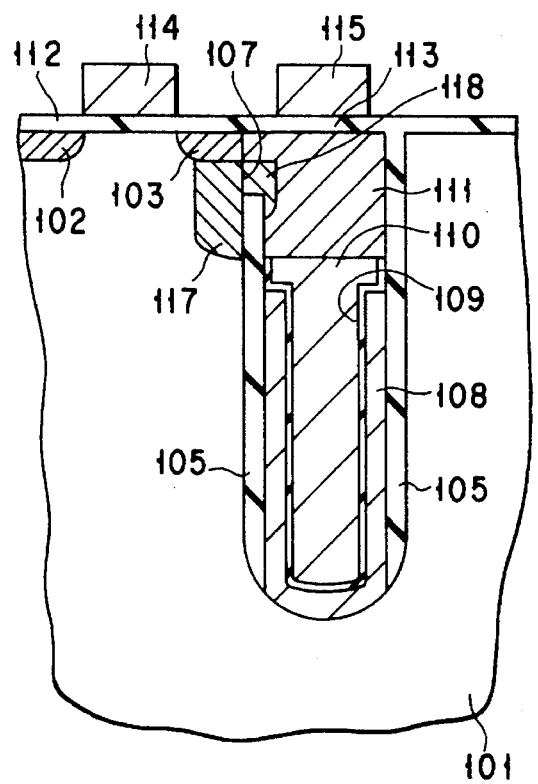
FIG. 12 is a cross-sectional view showing the structure of the essential portion of the trench capacitor cell of a DRAM according to a third embodiment of this invention.
Figure 13:
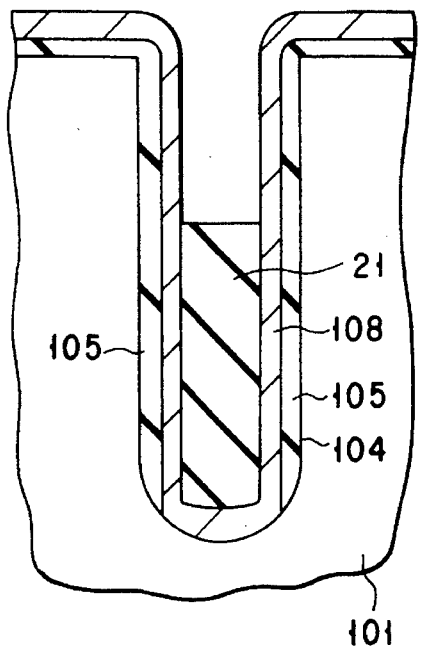

FIG. 12 presents a cross-sectional view showing the structure of the essential portion of the trench capacitor cell of a DRAM according to the third embodiment of this invention.

The structure in FIG. 12 differs from the structure in FIG. 3 in that a P type impurity is doped in the substrate from the window 107 and a P type region 117 is formed in contact with and under the N type region 103 as the source/drain region. Further, a P type region 118 is provided in the monocrystalline silicon film 111 filling the trench, through the window 107, in such a way as to contact the P type region 117. The P type region 118 is patterned to cover around the edge portions of the insulating film 105 under the window 107.

FIGS. 13 through 17 present cross-sectional views illustrating the step-by-step fabrication method for the structure shown in FIG. 12. First, the trench 104 having a diameter of about 0.5 μm is formed 5 μm deep from the surface of the silicon substrate 101. Next, the trench's inner wall is coated with the $SiO_2$ film 105 having a thickness of approximately 20 nm by high temperature thermal oxidation, and the substrate at the trench's bottom is exposed by anisotropic etching. Then, the polycrystalline silicon film 108 having a thickness of about 50 nm is formed in the trench. The polycrystalline silicon film 108 which becomes the lower capacitor electrode is doped with phosphorus of a high concentration at the time or after the film 108 is formed. Next, a resist 21 is buried to the height of about 3 μm from the trench's bottom.

Next, with the resist 21 used as a mask, the exposed polycrystalline silicon film 108 is removed by isotropic dry etching. The buried resist 21 is removed and the SiN film 109 is deposited about 5 nm thick on the polycrystalline silicon film 108 and the $SiO_2$ film 105 by the CVD technique. Next, as shown in FIG. 7, the polycrystalline silicon film 110, which becomes the first upper capacitor electrode and is doped with high-concentration phosphorus, is deposited in the trench by the CVD technique, and the polycrystalline silicon film 110 is selectively etched back by isotropic dry etching. Through this treatment, the polycrystalline silicon film 110 is buried to the height of about 3.5 μm from the trench's bottom. Thereafter, with the polycrystalline silicon film 110 as a mask, the exposed SiN film 109 is removed by a hot $H_3PO_4$ solution (FIG. 14).

Then, a resist 25 is formed on the substrate 101 in such a way as to expose a part of the region around the upper portion of the trench. With the resist 25 as a mask, the exposed $SiO_2$ film 105 is removed by a buffer HF solution. Subsequently, boron with a concentration of $1\times10^{19}/cm^3$ is obliquely ion-injected in the exposed substrate to form the P type region 117 in the window 107 (FIG. 15).

After the resist 25 is removed, the N type monocrystalline silicon film 111 which becomes the second upper capacitor electrode is grown on the polycrystalline silicon film 110 using the substrate exposed through the window 107 as seed crystal under the atmosphere of $SiCl_4+H_2$ gas, filling the upper portion inside the trench. The impurity injection in the monocrystalline silicon film 111 may be executed after the film 111 is formed. The impurity concentration of the N type monocrystalline silicon film 111 is set to about $1\times10^{18}/cm^3$, for example (FIG. 16).

Next, the resultant structure is etched back including the $SiO_2$ film 105 on the substrate 101 to form the gate insulating films 112 and 113, i.e., the $SiO_2$ film in the same step. Then, memory cell transistors of a DRAM are formed by a well known technique. More specifically, the gate electrodes 114 and 115 are patterned on the $SiO_2$ film (112, 113), and the N type regions 102 and 103 which become the source/drain regions are formed using the gate electrodes 114 and 115 as masks. A heat treatment is provided during the above-described sequence of procedures, so that the impurity in the P type region 117 is thermally diffused into the monocrystalline silicon film 111 via the window 107, forming the P type region 118. Through the above processes, the structure in FIG. 12 is obtained.

According to the third embodiment, the P type regions 117 and 118 can block the route that would cause the inversion layer formed along the substrate side surface of the trench or the depletion layer to generate the leak current on the substrate side.

Figure 18:
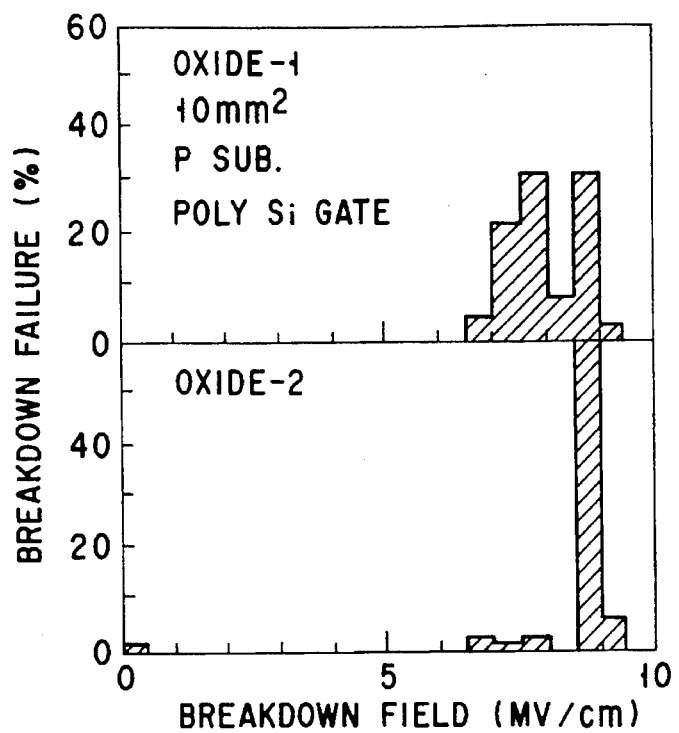
FIG. 18 is a characteristic chart showing breakdown data of an oxide film on a monocrystalline silicon film.

According to the above-described embodiments, the upper portion inside the trench is filled with a monocrystalline silicon film. Accordingly, the oxide film (113) on the monocrystalline silicon film as an insulating film to the gate electrode 115 on the trench can ensure a sufficient breakdown voltage to the overlying polycrystalline silicon film even if the oxide film has the thickness of the gate oxide film of a transistor. For example, FIG. 18 presents a characteristic chart illustrating breakdown data of the oxide film when a polycrystalline silicon gate is formed on the oxide film on the monocrystalline silicon substrate. Both types of oxide films (oxide-1 and oxide-2) have a thickness of 19.8 nm and their breakdown voltages raise no problems in the practical use under 3 MV/cm.

Since the insulating film 113 need not be formed thick, but thin, on the trench, crystal defects hardly occur in the substrate around the upper portion of the trench. Therefore, the junction leak would not be accelerated. Further, the P type region (116, 117, 118) which avoids the gate control diode structure is formed, so that the substantial area of the underlying capacitor hardly changes. It is therefore possible to decrease the junction leak current without reducing the capacitance of the trench capacitor.

Figure 19:
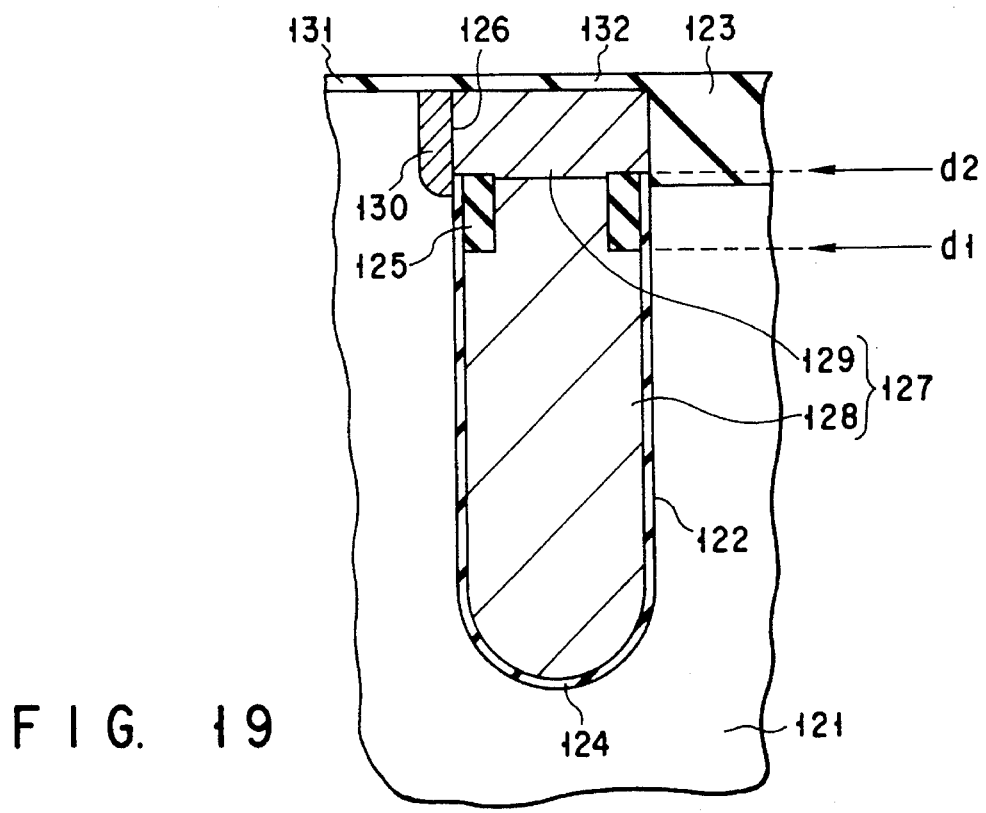
FIG. 19 is a cross-sectional view showing the structure of the essential portion of the trench capacitor cell of a DRAM according to a fourth embodiment of this invention.

The present invention is not limited to the above-described embodiments, but may be embodied in various other forms. For instance, FIG. 19 showing the fourth embodiment is a cross-sectional view showing the structure of the capacitor portion of a substrate plate type cell having a capacitor insulating film directly provided in the substrate. A trench 122 is formed in the surface of a P type region on a monocrystalline silicon substrate 121. The trench 122 is formed adjacent to a device isolating oxide film 123 on the substrate. A capacitor insulating film (NO film) 124 is coated on the side wall of the trench 122. The side wall at the upper periphery of the trench is coated with a thick oxide film 125. A part of the region covered with the oxide film 125 is removed to form a window 126. An N type capacitor electrode 127 is formed covering the capacitor insulating film 124 and the oxide film 125 in the trench 122. The portion of the capacitor electrode 127 which lies below the oxide film 125 is a polycrystalline silicon film 128, and the upper portion of the capacitor electrode 127 which contacts the window 126 is a monocrystalline silicon film 129. An N type region 130 is formed in the substrate near the window 126. Formed on the monocrystalline silicon film 129 is an insulating film 132 similar to a gate insulating film 131 on the substrate.

According to the fabrication method illustrated in FIG. 19, first, a capacitor insulating film 124 is coated on the inner wall of the trench 122 formed adjacent to a device isolating oxide film 123. Next, a polycrystalline silicon film (128) is formed inside the trench by CVD, and is etched back to the position of an arrow d1. Then, a oxide film is formed by CVD and the entire surface is etched back by RIE, leaving the oxide film (125) on the inner side wall of the trench. Subsequently, a polycrystalline silicon film (128) is formed by CVD and is etched back to the position of an arrow d2. Further, the oxide film (125) on the side wall and the capacitor insulating film (124) are removed to the position of the arrow d2. Then, a desired resist is formed and an N type monocrystalline silicon film 129 is grown on the polycrystalline silicon film 128 with the substrate exposed through the window 126 used as a seed crystal, filling the upper portion of the trench. The oxide film on the substrate is removed, the gate insulating film 131 and the insulating film 132 having the same thickness as the insulating film 131, are formed simultaneously, and a memory cell transistor of a DRAM is formed by a known technology.

Even in the above embodiment, as in the second and third embodiments, it is preferable that the P type region be formed under the N type region 130 or the P type region extending inside the monocrystalline silicon film 129 be formed via the window 126.

According to the present invention, as described above, crystal defects and the gate control diode structure can be avoided without reducing the trench capacitance, contributing to the improvement on the integration and ensuring large memory capacity. It is therefore possible to provide a highly reliable semiconductor memory device and a method of fabricating this semiconductor memory device.

Figure 20:
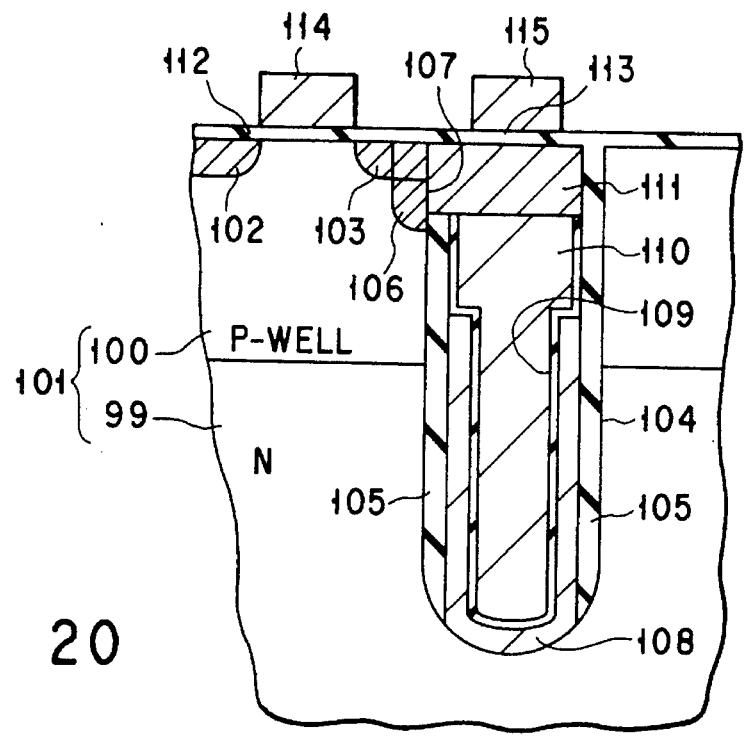
FIG. 20 is a cross-sectional view showing a first example of the substrate for which the trench capacitor cell of a DRAM embodying this invention is adapted, in association with FIG. 3.
Figure 21:
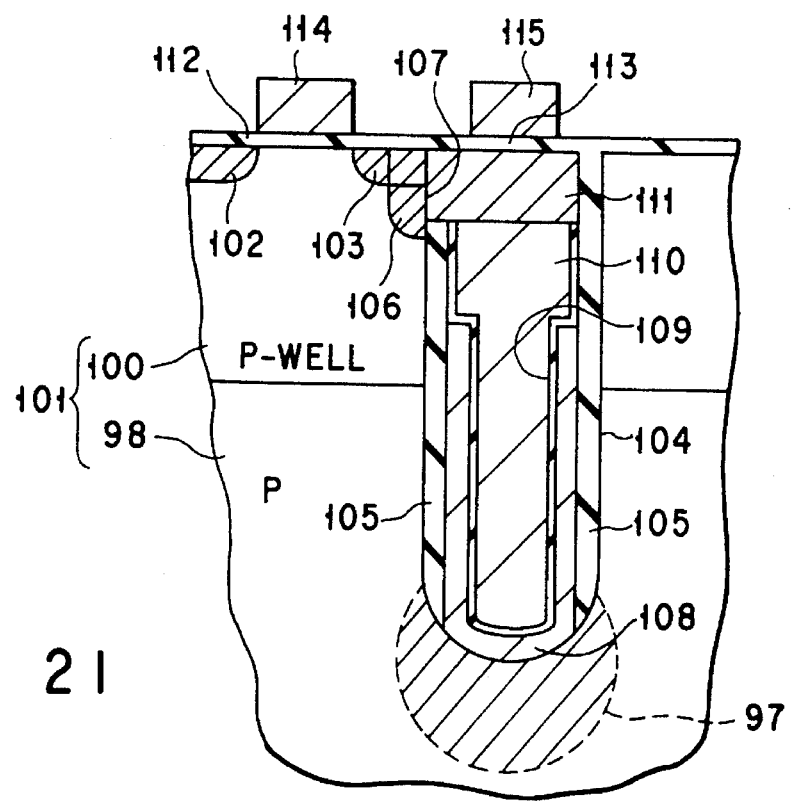
FIG. 21 is a cross-sectional view showing a second example of the substrate for which the trench capacitor cell of a DRAM embodying this invention is adapted, in association with FIG. 3.

The monocrystalline silicon film 101 in each embodiment may consist of the P type well region 100 formed on an N type substrate 99 as shown in FIG. 20 showing a first example in association with FIG. 3, or may consist of a P type well region 100 formed in a P type substrate 98 as shown in FIG. 21 showing a second example in association with FIG. 3. With the use of the latter P type substrate 98, a potential supplying N type region, which contacts an N type polycrystalline silicon film 108 that becomes the lower capacitor electrode, is provided in the P type substrate 98 as shown in FIG. 21. This N type region 97 may be formed by a method that forms the trench and then diffuses an impurity in the substrate from the trench's bottom, a method that previously forms a buried diffusion layer in the substrate, and the like.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device, comprising:

a semiconductor substrate of a first conductivity type;

a switching transistor formed on said semiconductor substrate, said switching transistor including a conductor region of a second conductivity type formed in a surface of said semiconductor substrate, and a gate insulatively spaced from a surface of said semiconductor substrate by a gate insulating film;

a trench formed adjacent to said conductor region in said semiconductor substrate;

a capacitor insulating film formed in said trench;

a capacitor electrode formed to bury said trench, at least an upper portion of said capacitor electrode in said trench being monocrystalline; and an insulating film formed on said capacitor electrode, wherein said insulating film formed on said capacitor electrode has a same thickness as the gate insulating film of said switching transistor.

2. The semiconductor memory device according to claim 1, further comprising a semiconductor region of the first conductivity type formed in said semiconductor substrate, said semiconductor region contacting said conductor region and being doped with an impurity with a higher concentration than said semiconductor substrate.

3. The semiconductor memory device according to claim 1, further comprising:

a first semiconductor region of the first conductivity type formed in said semiconductor substrate, said first semiconductor region contacting said conductor region and the monocrystalline upper portion of said capacitor electrode and being doped with an impurity with a higher concentration than said semiconductor substrate; and a second semiconductor region of the first conductivity type contacting said first semiconductor region and formed in the monocrystalline upper portion of said capacitor electrode.

4. A semiconductor memory device, comprising:

a semiconductor substrate of a first conductivity type;

a switching transistor formed on said semiconductor substrate, said switching transistor including a conductor region of a second conductivity type formed in a surface of said semiconductor substrate, and a gate insulatively spaced from a surface of said semiconductor substrate by a gate insulating film;

a trench formed adjacent to said conductor region in said semiconductor substrate;

a first insulating film formed on at least an upper portion of a side wall of said trench;

a capacitor insulating film formed in said trench;

a capacitor electrode formed to bury said trench, at least an upper portion of said capacitor electrode in said trench being monocrystalline;

a window formed by removing said first insulating film at one part of an upper periphery of said trench, the monocrystalline upper portion of said capacitor electrode being electrically connected to said conductor region through said window; and a second insulating film for covering said capacitor electrode, wherein said second insulating film has a same thickness as the gate insulating film of said switching transistor.

5. The semiconductor memory device according to claim 4, wherein said conductor region extends entirely over said window and also in a depth direction near said window.

6. The semiconductor memory device according to claim 4, further comprising a semiconductor region of the first conductivity type formed in said semiconductor substrate, said semiconductor region contacting said conductor region and being doped with an impurity with a higher concentration than said semiconductor substrate.

7. The semiconductor memory device according to claim 4, further comprising:

a first semiconductor region of the first conductivity type formed in said semiconductor substrate, said first semiconductor region contacting said conductor region and the monocrystalline upper portion of said capacitor electrode and being doped with an impurity with a higher concentration than said semiconductor substrate; and a second semiconductor region of the first conductivity type contacting said first semiconductor region and formed in the monocrystalline upper portion of said capacitor electrode.

8. A semiconductor memory device, comprising:

a semiconductor substrate of a first conductivity type;

a switching transistor formed on said semiconductor substrate, said switching transistor including a conductor region of a second conductivity type formed in a surface of said semiconductor substrate, and a gate insulatively spaced from a surface of said semiconductor substrate by a gate insulating film;

a trench formed adjacent to said conductor region in said semiconductor substrate;

a lower capacitor electrode formed in said trench and having an upper edge portion lying below said conductor region;

a first insulating film formed on at least a portion of an inner wall of said trench which extends from the upper edge portion of said lower capacitor electrode to said conductor region;

a capacitor insulating film for covering a surface of said lower capacitor electrode;

a first upper capacitor electrode portion formed in said trench and contacting said capacitor insulating film;

a monocrystalline second upper capacitor electrode portion extending to said first upper capacitor electrode to contact said conductor region and fill said trench;

a window formed by removing said first insulating film at one part of an upper periphery of said trench, the monocrystalline second upper capacitor electrode being electrically connected to said conductor region through said window; and a second insulating film for covering said second upper capacitor electrode, wherein said second insulating film has a same thickness as the gate insulating film of said switching transistor.

9. The semiconductor memory device according to claim 8, wherein said first insulating film extends over an inner side wall of said trench excluding a bottom portion of said trench, and said lower capacitor electrode is covered over a portion from a bottom of said trench to a surface of said first insulating film.

10. The semiconductor memory device according to any one of claims 8 and 9, further comprising a semiconductor region of the first conductivity type formed in said semiconductor substrate, said semiconductor region contacting said conductor region and being doped with an impurity with a higher concentration than said semiconductor substrate.

11. The semiconductor memory device according to any one of claims 8 and 9, further comprising:

a first semiconductor region of the first conductivity type formed in said semiconductor substrate, said first semiconductor region contacting said conductor region and the monocrystalline upper portion of said capacitor electrode and being doped with an impurity with a higher concentration than said semiconductor substrate; and a second semiconductor region of the first conductivity type contacting said first semiconductor region and formed in the monocrystalline upper portion of said capacitor electrode.

12. The semiconductor memory device according to claim 8, wherein said semiconductor substrate of the first conductivity type is a semiconductor region formed on a semiconductor substrate of the second conductivity type.

13. The semiconductor memory device according to claim 8, wherein said semiconductor substrate of the first conductivity type is a semiconductor region formed on a semiconductor substrate of the first conductivity type.

14. The semiconductor memory device according to claim 9, wherein said semiconductor substrate of the first conductivity type is a semiconductor region formed on a semiconductor substrate of the first conductivity type and further includes a semiconductor region of the second conductivity type formed in said semiconductor substrate of the first conductivity type and electrically connected to said lower capacitor electrode.

15. A semiconductor memory device, comprising:

a semiconductor substrate;

a trench formed in said semiconductor substrate;

a trench capacitor formed in said trench and including an electrode having an electrode portion of monocrystalline silicon;

a transfer transistor including source/drain regions formed on a surface of said semiconductor substrate and a control gate, constituted by a portion of a first word line, spaced from a channel region between said source/drain regions by a first insulating film portion of a first thickness; and a second insulating film portion of a thickness equal to the thickness of said first insulating film portion for insulating said trench capacitor from a second word line, said second insulating film contacting said monocrystalline silicon electrode portion of said electrode.

16. A semiconductor memory device, comprising:

a semiconductor substrate of a first conductivity type;

a conductor region of a second conductivity type formed in a surface of said semiconductor substrate;

a trench formed adjacent to said conductor region in said semiconductor substrate;

a capacitor insulating film formed in said trench;

a capacitor electrode formed to bury said trench, at least an upper portion of said capacitor electrode in said trench being monocrystalline;

an insulating film formed on said capacitor electrode;

a first semiconductor region of the first conductivity type formed in said semiconductor substrate, said first semiconductor region contacting said conductor region and the monocrystalline upper portion of said capacitor electrode and being doped with an impurity with a higher concentration than said semiconductor substrate; and a second semiconductor region of the first conductivity type contacting said first semiconductor region and formed in the monocrystalline upper portion of said capacitor electrode.

17. A semiconductor memory device, comprising:

a semiconductor substrate of a first conductivity type;

a conductor region of a second conductivity type formed in a surface of said semiconductor substrate;

a trench formed adjacent to said conductor region in said semiconductor substrate;

a first insulating film formed on at least an upper portion of a side wall of said trench;

a capacitor insulating film formed in said trench;

a capacitor electrode formed to bury said trench, at least an upper portion of said capacitor electrode in said trench being monocrystalline;

a window formed by removing said first insulating film at one part of an upper periphery of said trench, the monocrystalline upper portion of said capacitor electrode being electrically connected to said conductor region through said window;

a second insulating film for covering said capacitor electrode;

a first semiconductor region of the first conductivity type formed in said semiconductor substrate, said first semiconductor region contacting said conductor region and the monocrystalline upper portion of said capacitor electrode and being doped with an impurity with a higher concentration than said semiconductor substrate; and a second semiconductor region of the first conductivity type contacting said first semiconductor region and formed in the monocrystalline upper portion of said capacitor electrode.

* * * * *